US012784849B2

(12) United States Patent
Han et al.

(10) Patent No.: US 12,784,849 B2
(45) Date of Patent: Nov. 3, 2026

(54) SEMICONDUCTOR DEVICE AND METHOD OF OPERATING THE SEMICONDUCTOR DEVICE

(71) Applicant: SK hynix Inc., Icheon-si (KR)

(72) Inventors: Chang Hyun Han, Icheon-si (KR); Moon Soo Sung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 108 days.

(21) Appl. No.: 18/818,290

(22) Filed: Aug. 28, 2024

(65) Prior Publication Data

US 2025/0329398 A1 Oct. 23, 2025

(30) Foreign Application Priority Data

Apr. 17, 2024 (KR) ........................ 10-2024-0051633

(51) Int. Cl.
*G11C 16/34* (2006.01)
*G11C 16/08* (2006.01)
*G11C 16/24* (2006.01)

(52) U.S. Cl.
CPC .......... *G11C 16/3459* (2013.01); *G11C 16/08* (2013.01); *G11C 16/24* (2013.01)

(58) Field of Classification Search
CPC ..... G11C 16/3459; G11C 16/08; G11C 16/24; G11C 16/0483; G11C 16/10; G11C 16/30; G11C 16/3404; G11C 16/3454
USPC ........................................ 365/185.22, 185.24
See application file for complete search history.

(56) References Cited

U.S. PATENT DOCUMENTS 5,732,018 A * 3/1998 Choi .................... G11C 7/1051 365/185.21
5,761,123 A * 6/1998 Kim ....................... G11C 7/065 365/207
9,082,487 B2 * 7/2015 Koo ....................... G11C 16/10
10,741,272 B2 * 8/2020 Venkat ................... G16H 50/70
11,056,203 B1 * 7/2021 Yang .................. G11C 16/3459
2002/0007476 A1 * 1/2002 Kishino .............. G06F 11/1028 714/763
2010/0182841 A1 * 7/2010 Lee ........................ G11C 16/26 365/185.21
2010/0195385 A1 * 8/2010 Lim .................... G11C 11/5628 365/185.25
2010/0329028 A1 * 12/2010 Lim ................... G11C 16/3454 365/185.25
2011/0299341 A1 * 12/2011 Lim ....................... G11C 16/10 365/185.24

(Continued)

FOREIGN PATENT DOCUMENTS

KR 101016078 B1 2/2011
KR 1020120015725 A 2/2012
KR 20230075916 A * 5/2023 ......... G11C 16/3459

*Primary Examiner* — Michael T Tran

(74) *Attorney, Agent, or Firm* — WILLIAM PARK AND ASSOCIATES LTD.

(57) ABSTRACT

A memory device includes a bit line control circuit and a row decoder. The bit line control circuit applies a verification precharge voltage after a program pulse period to a program-inhibited bit line maintaining a program-inhibited voltage during the program pulse period. The row decoder forms a channel in a string coupled between the program-inhibited bit line and a source line. The program-inhibited voltage of the program-inhibited bit line is discharged through the channel to the verification precharge voltage.

19 Claims, 7 Drawing Sheets

(56) References Cited

U.S. PATENT DOCUMENTS

2012/0327718 A1* 12/2012 Lee .................... G11C 16/0483
365/185.2
2013/0163360 A1* 6/2013 Seo .................... G11C 16/3445
365/218
2014/0369134 A1* 12/2014 Baik .................. G11C 16/3459
365/185.22
2014/0376315 A1* 12/2014 Park .................... G11C 11/5642
365/185.21
2015/0003157 A1* 1/2015 Aritome ............. G11C 16/3427
365/185.11
2016/0260484 A1* 9/2016 Lim ....................... G11C 16/24
2017/0011799 A1* 1/2017 Lee ........................ G11C 16/10
2017/0154677 A1* 6/2017 Lim ................... G11C 16/3459
2017/0236595 A1* 8/2017 Maejima ............ G11C 16/0483
365/185.12
2018/0068738 A1* 3/2018 Kato .................. G11C 16/3459
2018/0211715 A1* 7/2018 Cho ....................... G11C 16/10
2019/0066808 A1* 2/2019 Nale ..................... G11C 11/406
2019/0318784 A1* 10/2019 Lee .................... G11C 16/0483
2020/0251158 A1* 8/2020 Shore .................... G11C 11/408
2021/0193227 A1* 6/2021 Kim ....................... G11C 29/52
2021/0366545 A1 11/2021 Liu et al.
2022/0051728 A1* 2/2022 Chai ...................... G11C 16/24
2023/0040560 A1* 2/2023 Kim ....................... G11C 16/10
2024/0379169 A1* 11/2024 Chen ...................... G11C 16/24

* cited by examiner

SEMICONDUCTOR DEVICE AND METHOD OF OPERATING THE SEMICONDUCTOR DEVICE

CROSS-REFERENCES TO RELATED APPLICATION

The present application claims priority under 35 U.S.C. § 119(a) to Korean patent application number 10-2024-0051633 filed on Apr. 17, 2024, in the Korean Intellectual Property Office, which application is incorporated herein by reference in its entirety.

BACKGROUND

1. Technical Field

Various embodiments generally relate to a semiconductor device, and, more particularly, to a memory device and a method of operating the memory device.

2. Related Art

Electronic devices include many electronic components, and among them, a computer system may include many electronic components composed of semiconductors. Among the semiconductor devices constituting the computer system, a host device, such as a processor or a memory controller, can perform data communication with a memory device. The memory device may include a plurality of memory cells which may be specified by word lines and bit lines. The memory device may perform a program operation to store data in its memory cells.

SUMMARY

In an embodiment, a memory device may include a bit line control circuit and a row decoder. The bit line control circuit may be configured to apply a verification precharge voltage after a program pulse period to a program-inhibited bit line maintaining a program-inhibited voltage during the program pulse period. The row decoder may be configured to form a channel in a string coupled between the program-inhibited bit line and a source line. The program-inhibited voltage of the program-inhibited bit line may be discharged through the channel to the verification precharge voltage.

In an embodiment, a memory device may include a bit line control circuit and a row decoder. The bit line control circuit may be configured to apply a program-inhibited voltage to a program-inhibited bit line before a program pulse period, and may be configured to apply a verification precharge voltage to the program-inhibited bit line at a precharge time after the program pulse period. The program-inhibited voltage of the program-inhibited bit line may be discharged to the verification precharge voltage. The row decoder may be configured to apply a verification voltage to a selected word line while the verification precharge voltage is being applied to the program-inhibited bit line.

In an embodiment, a method of performing a program operation with a memory device may include determining, with a control circuit, a precharge method for a program verification operation as a first precharge method when a program operation is determined to be completed for a predetermined program state among a plurality of program states, and discharging, with a peripheral circuit, a program-inhibited voltage of a program-inhibited bit line to a verification precharge voltage after a program pulse period according to the first precharge method.

DETAILED DESCRIPTION

Various embodiments of the present disclosure can perform program operations with improved performance.

Hereinafter, embodiments of the present disclosure will be described in more detail with reference to the accompanying drawings.

Figure 1:
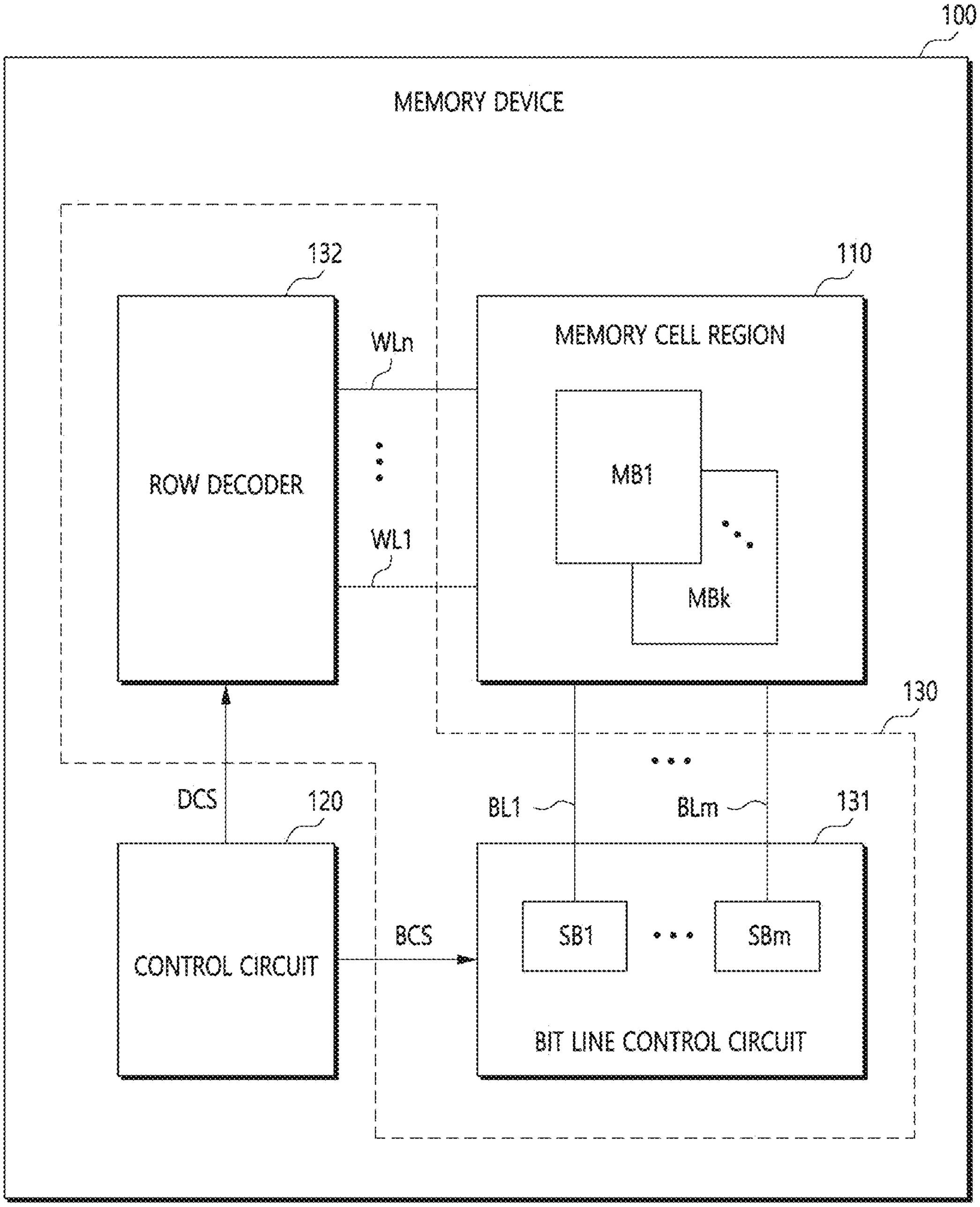
FIG. 1 is a block diagram illustrating a memory device according to an embodiment of the present disclosure.

FIG. 1 is a block diagram illustrating a memory device 100 according to an embodiment of the present disclosure.

Referring to FIG. 1, the memory device 100 may store data under control of an external device.

The memory device 100 may include various types of memory such as NAND Flash memory, three-dimensional NAND Flash memory, NOR Flash memory, resistive random access memory (RRAM), phase-change random access memory (PRAM), magnetoresistive random access memory (MRAM), ferroelectric random access memory (FRAM), or spin transfer torque random access memory (STT-RAM).

The memory device 100 may include a memory cell region 110, a control circuit 120, and a peripheral circuit 130.

The memory cell region 110 may include a plurality of memory blocks MB1 to MBk. A memory block may be a unit in which the memory device 100 performs an erase operation. Data stored in a memory block may be erased simultaneously. Each of the memory blocks MB1 to MBk may be coupled to the peripheral circuit 130 through word lines WL1 to WLn and bit lines BL1 to BLm. Each of the memory blocks MB1 to MBk may include a plurality of memory cells in which data is stored. The words "simultaneous" and "simultaneously" as used herein with respect to processes mean that the processes take place on overlapping intervals of time. For example, if a first process takes place over a first interval of time and a second process takes place simultaneously over a second interval of time, then the first and second intervals at least partially overlap each other such that there exists a time at which the first and second processes are both taking place.

Figure 2:
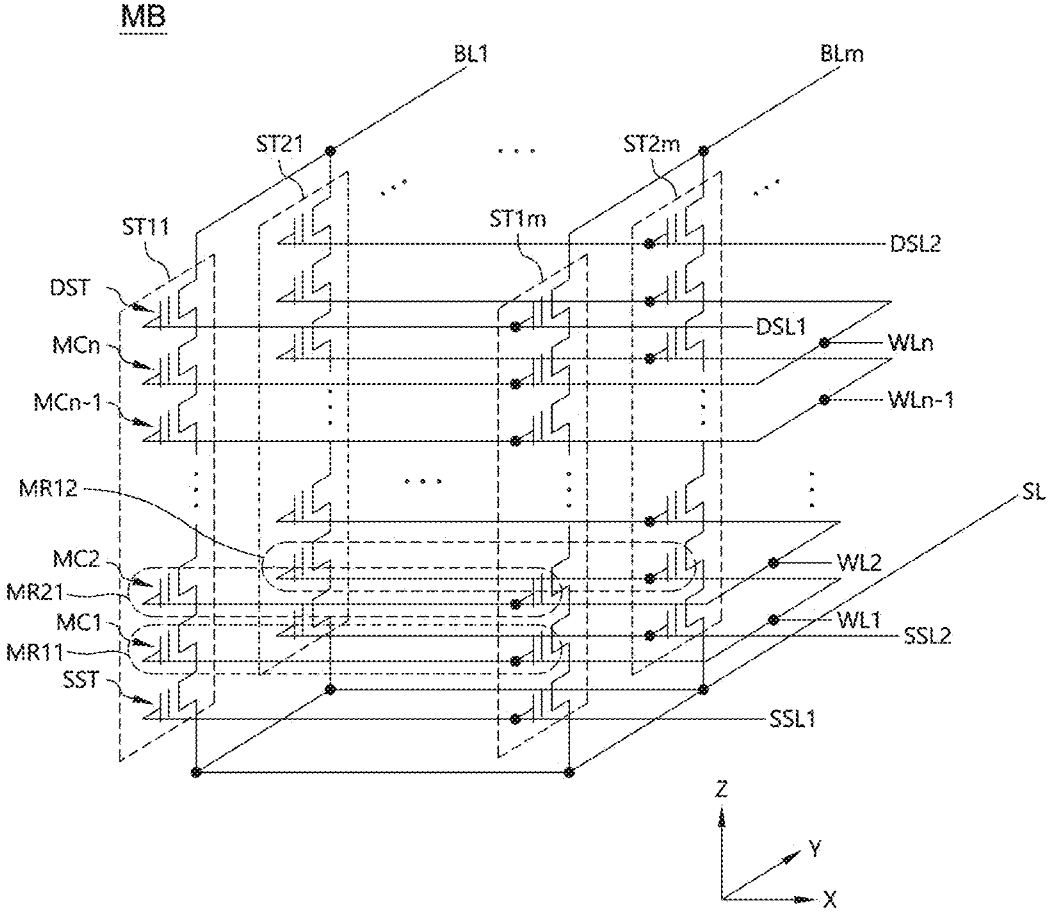
FIG. 2 is a circuit diagram illustrating a memory block according to an embodiment of the present disclosure.

FIG. 2 is a circuit diagram illustrating a memory block MB according to an embodiment of the present disclosure.

Each of the memory blocks MB1 to MBk of FIG. 1 may be configured similarly to the memory block MB of FIG. 2.

Referring to FIG. 2, the memory block MB may be coupled to the peripheral circuit 130 through drain selection lines DSL1, DSL2, source selection lines SSL1, SSL2, word lines WL1 to WLn, bit lines BL1 to BLm, and a source line SL.

The memory block MB may include strings ST11 to ST1*m*, ST21 to ST2*m*. Each of the strings ST11 to ST1*m*, ST21 to ST2*m* may extend along a vertical direction (Z direction). Within the memory block MB, m strings may be arranged in a row direction (X direction). In FIG. 2, two strings are shown arranged in a column direction (Y direction), but this is for illustrative purposes only, and three or more strings may be arranged in the column direction (Y direction).

The strings ST11 to ST1*m*, ST21 to ST2*m* may be configured identically. For example, the string ST11 may include a source selection transistor SST, memory cells MC1 to MCn, and a drain selection transistor DST, coupled in series with each other between the source line SL and the bit line BL1. A source of the source selection transistor SST may be coupled to the source line SL, and a drain of the drain selection transistor DST may be coupled to the bit line BL1. The memory cells MC1 to MCn may be coupled in series with each other between the source selection transistor SST and the drain selection transistor DST. In an embodiment, a plurality of source selection transistors may be coupled in series between the source line SL and the memory cell MC1. In an embodiment, a plurality of drain selection transistors may be coupled in series between the bit line BL1 and the memory cell MCn.

Source selection transistors at the same position in a vertical direction may be configured as shown below. Specifically, the gates of the source selection transistors of strings arranged in the same row may be coupled to the same source selection line. For example, the gates of the source selection transistors of strings ST11 to ST1*m* in a first row may be coupled to a source selection line SSL1. For example, the gates of the source selection transistors of a second row of strings ST21 to ST2*m* may be coupled to a source selection line SSL2.

In an embodiment, source selection transistors of two or more rows of strings may be coupled in common to a single source selection line. For example, the source selection transistors of the first and second rows of strings ST11 to ST1*m*, ST21 to ST2*m* may be coupled in common to one source selection line, and the source selection transistors of the third and fourth rows of strings may be coupled in common to one source selection line.

Drain selection transistors at the same position in a vertical direction may be configured as shown below. For example, the gates of the drain selection transistors of strings arranged in the same row may be coupled to the same drain selection line. For example, the gates of the drain selection transistors of the strings ST11 to ST1*m* of the first row may be coupled to the drain selection line DSL1. For example, the gates of the drain selection transistors of the second row of the strings ST21 to ST2*m* may be coupled to the drain selection line DSL2.

Strings arranged in the same column may be coupled to the same bit line. For example, strings ST11, ST21 in a first column may be coupled to the bit line BL1. For example, strings ST1*m*, ST2*m* in an mth column may be coupled to the bit line BLm.

Gates of memory cells at the same position in a vertical direction may be coupled to the same word line. For example, in strings ST11 to ST1*m* and ST21 to ST2*m*, memory cells that are at the same position in a direction perpendicular to the memory cell MC1 may be coupled to the word line WL1.

Among the memory cells, memory cells coupled to the same word line in the same row may constitute one memory region. For example, memory cells coupled to the word line WL1 in the first row may constitute one memory region MR11. For example, memory cells coupled to the word line WL1 in the second row may constitute one memory region MR12. For example, memory cells coupled to word line WL2 in the first row may constitute one memory region MR21. Depending on the number of rows, each word line may be coupled to multiple memory regions. The memory cells constituting one memory region may be accessed simultaneously.

In an embodiment, the memory block MB may be further coupled to one or more dummy word lines other than the word lines WL1 to WLn. In this case, the memory block MB may further include dummy memory cells coupled to the dummy word lines.

A memory cell may store one or more bits. A memory cell that stores one bit may be referred to as a single level cell (SLC), and a memory region and a memory block comprising SLCs may be referred to as an SLC memory region and an SLC memory block, respectively. A memory cell that stores multiple bits may be referred to as Extra Level Cell (XLC), and a memory region and a memory block comprising XLCs may be referred to as an XLC memory region and an XLC memory block, respectively. The XLC may include a Multi-Level Cell (MLC), a Triple Level Cell (TLC), a Quad Level Cell (QLC), and the like. The decision of how many bits to store in a memory cell (i.e., whether to use the memory cell as an SLC, MLC, TLC, QLC, or XLC) may be changed by an external device during an operation of the memory device 100.

Referring again to FIG. 1, the control circuit 120 may store data in the memory cell region 110 by performing a program operation on the memory cell region 110 under control of the external device. To perform the program operation, the control circuit 120 may control an operation of the peripheral circuit 130. For example, the control circuit 120 may generate bit line control signals BCS and output them to a bit line control circuit 131 to control the bit line control circuit 131 included in the peripheral circuit 130. The bit line control signals BCS may include a precharge control signal and a discharge signal. In addition, the control circuit 120 may generate and output row decoder control signals DCS to the row decoder 132 to control the row decoder 132 included in the peripheral circuit 130.

The control circuit 120 may perform a program operation on selected memory cells coupled to a selected word line of the word lines WL1 to WMn. To determine if the program operation is complete for the selected memory cells, the control circuit 120 may determine a precharge method and perform a program verification operation based on the precharge method. In an embodiment, the control circuit 120 may determine a precharge method as a first precharge method when a program operation is determined to be complete for a predetermined program state among a plurality of program states that the selected memory cells will form through the program operation. The first precharge method may be to discharge a program-inhibited voltage of a program-inhibited bit line to a verification precharge voltage without discharging the program-inhibited voltage to a ground voltage, after a program pulse period during which the program pulse is applied to the selected word line.

The control circuit 120 may determine the precharge method to be a second precharge method when a program operation is determined to be incomplete for a predetermined program state. The second precharge method may comprise, after a program pulse period, discharging a program-inhibited voltage of a program-inhibited bit line to a ground voltage and then precharging the program-inhibited bit line to a verification precharge voltage. The word "predetermined" as used herein with respect to a parameter, such as a predetermined program state, voltages, program control voltage, verification control voltage, or number, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

A program-inhibited bit line may be a bit line coupled to a program-inhibited memory cell of the selected memory cells. The program-inhibited memory cell may be a memory cell among the selected memory cells having a threshold voltage that should not be raised by a program pulse. A program-inhibited memory cell may be a memory cell of the selected memory cells for which a program operation has completed.

A program-allowed bit line may be a bit line coupled to a program-allowed memory cell among the selected memory cells. The program-allowed memory cell may be a memory cell among the selected memory cells having a threshold voltage that is to be raised by a program pulse. The program-allowed memory cell may be a memory cell of the selected memory cells for which a program operation is incomplete.

The peripheral circuit 130 may perform a program operation on the selected memory cells in the memory cell region 110 under control of the control circuit 120. The peripheral circuit 130 may include the bit line control circuit 131 and the row decoder 132.

The bit line control circuit 131 may be coupled to the memory cell region 110 through bit lines BL1 to BLm. The bit line control circuit 131 may include a plurality of sub-circuits SB1 to SBm each coupled to the bit lines BL1-BLm. The sub-circuits SB1 to SBm may be coupled to memory cells included in the memory cell region 110 through the bit lines BL1 to BLm. The sub-circuits SB1 to SBm may store write data to be stored in the selected memory cells through program operations. The sub-circuits SB1 to SBm may operate simultaneously in response to the bit line control signals BCS, such that the memory cells coupled to each of the bit lines BL1 to BLm may be accessed simultaneously.

In a program operation, the bit line control circuit 131 may apply a program-inhibited voltage to a program-inhibited bit line and a program-allowed voltage to a program-allowed bit line before a program pulse period. The bit line control circuit 131 may apply a verification precharge voltage to a program-inhibited bit line and a program-allowed bit line after the program pulse period.

The row decoder 132 may be coupled to the memory cell region 110 through the word lines WL1 to WLn. The row decoder 132 may apply predetermined voltages to the word lines WL1 to WLn under control of the control circuit 120.

In a program operation, the row decoder 132 may apply a program pulse to a selected word line of the word lines WL1 to WLn during the program pulse period. After the program pulse period, the row decoder 132 may form a channel in a string coupled between a program-inhibited bit line and a source line. In an embodiment, the channel in the string coupled between a program-inhibited bit line and the source line permits current to flow between the program-inhibited bit line and the source line in the string. Thus, a program-inhibited voltage of the program-inhibited bit line may be discharged through the channel in the string to a verification precharge voltage.

Although not shown, the peripheral circuit 130 may further include an interface configured to communicate with an external device. The interface may pass control signals and data received from the external device to the control circuit 120, the bit line control circuit 131, and the row decoder 132. The peripheral circuit 130 may further include a voltage generation circuit configured to generate various voltages. The voltage generation circuit may pass the generated voltages to the bit line control circuit 131 and the row decoder 132 under control of the control circuit 120.

Each of the control circuit 120 and peripheral circuit 130 may comprise hardware, software, firmware, or a combination thereof.

Figure 3:
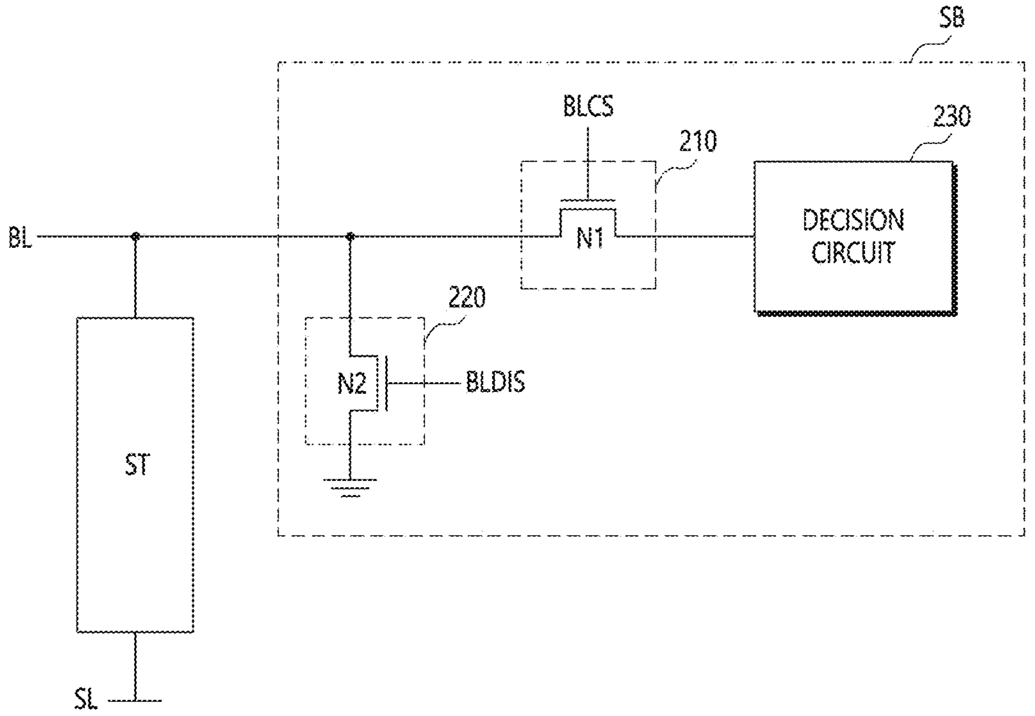
FIG. 3 is a circuit diagram illustrating a configuration of a sub-circuit according to an embodiment of the present disclosure.

FIG. 3 is a circuit diagram illustrating a configuration of a sub-circuit SB according to an embodiment of the present disclosure. Each of the sub-circuits SB1 to SBm of FIG. 1 may be configured and operate similarly to the sub-circuit SB of FIG. 3.

Referring to FIG. 3, the sub-circuit SB may be coupled to a bit line BL. The bit line BL may correspond to each of the bit lines BL1 to BLm of FIG. 2. A string ST may be coupled between the bit line BL and the source line SL. The string ST may be any one of one or more strings coupled to the bit line BL. A program operation may be performed on selected memory cells of the memory cells included in the string ST.

The sub-circuit SB may apply a program-allowed voltage to the bit line BL in response to a program control voltage applied to a precharge control signal BLCS when the bit line BL is determined to be a program-allowed bit line. The sub-circuit SB may apply a program-inhibited voltage to the bit line BL in response to a program control voltage applied to the precharge control signal BLCS when the bit line BL is determined to be a program-inhibited bit line. The sub-circuit SB may apply a verification precharge voltage to the bit line BL in response to a verification control voltage applied to the precharge control signal BLCS.

The sub-circuit SB may include a precharge circuit 210, a discharge circuit 220, and a decision circuit 230.

The precharge circuit 210 may be coupled between the bit line BL and the decision circuit 230. The precharge circuit 210 may apply a program-inhibited voltage (e.g., a positive voltage) or a program-allowed voltage (e.g., a ground voltage or a negative voltage) to the bit line BL in response to a predetermined program control voltage applied to the precharge control signal BLCS. In an embodiment, the program-inhibited voltage and program-allowed voltage may be passed from the decision circuit 230 to the precharge circuit 210. Further, the precharge circuit 210 may apply a verification precharge voltage to the bit line BL in response to a predetermined verification control voltage applied to the precharge control signal BLCS. Further, the precharge circuit 210 may couple the bit line BL to the decision circuit 230 in response to the precharge control signal BLCS.

In an embodiment, the precharge circuit 210 may include a first NMOS transistor N1. A drain of the first NMOS transistor N1 may be coupled to the decision circuit 230, a source of the first NMOS transistor N1 may be coupled to the bit line BL, and a gate of the first NMOS transistor N1 may receive the precharge control signal BLCS. The first NMOS transistor N1 may be turned on in response to the precharge control signal BLCS, thereby supplying a voltage to the bit line BL. A verification precharge voltage applied to the bit line BL may be, for example, a voltage equal to a verification control voltage applied to the precharge control signal BLCS minus a threshold voltage of the first NMOS transistor N1. Further, the first NMOS transistor N1 may be turned on in response to the precharge control signal BLCS to couple the bit line BL and the decision circuit 230.

The discharge circuit 220 may be coupled between the bit line BL and a ground node. The discharge circuit 220 may discharge a voltage of the bit line BL in response to the discharge signal BLDIS.

In an embodiment, the discharge circuit 220 may include a second NMOS transistor N2. A drain of the second NMOS transistor N2 may be coupled to the bit line BL, a source of the second NMOS transistor N2 may be coupled to the ground node, and a gate of the second NMOS transistor N2 may receive the discharge signal BLDIS. The second NMOS transistor N2 may be turned on in response to the discharge signal BLDIS to discharge a voltage of the bit line BL.

The decision circuit 230 may store write data. The write data may be stored in selected memory cells of the string ST through the bit line BL. Further, the decision circuit 230 may sense a state of the bit line BL after a verification voltage is applied to selected memory cells and store a verification result.

Based on write data stored in the decision circuit 230 and the verification result, the decision circuit 230 may determine whether the bit line BL is a program-allowed bit line or a program-inhibited bit line. The decision circuit 230 may supply a program-allowed voltage to the precharge circuit 210 when the bit line BL is determined to be a program-allowed bit line. The decision circuit 230 may supply a program-inhibited voltage to the precharge circuit 210 when the bit line BL is determined to be a program-inhibited bit line.

Figure 4:
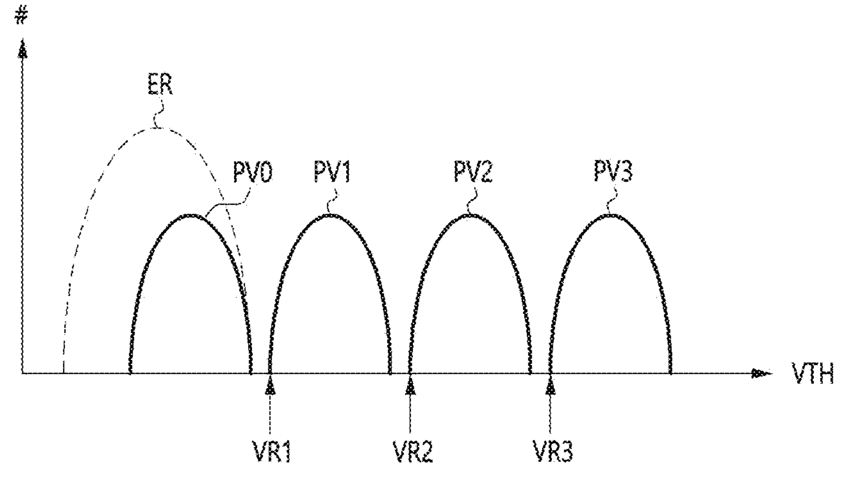
FIG. 4 is a diagram illustrating program states of memory cells according to an embodiment of the present disclosure.

FIG. 4 is a diagram illustrating program states PV0 to PV3 of memory cells according to an embodiment of the present disclosure. A horizontal axis VTH may denote a threshold voltage of a memory cell, and a vertical axis #may denote a number of memory cells having a corresponding threshold voltage.

Referring to FIG. 4, the memory cells may be in an erased state ER before a program operation is performed, and then may exist in program states PV0 to PV3 depending on the data stored through the program operation. Each memory cell may be in one of the program states PV0 to PV3, depending on the two bits of data stored in it. In an embodiment, when k bits are stored in each of the memory cells, the memory cells may exist in 2^k program states.

Briefly describing a program operation for the selected memory cells, the row decoder 132 may apply a program pulse to a selected word line coupled to the selected memory cells. Each of the bit lines of the memory cells that are to be in the program states PV1 to PV3 among the selected memory cells that were in an erase state ER may be precharged to a program-allowed voltage. Thus, the threshold voltages of the corresponding selected memory cells may rise in response to the program pulse.

To verify that the program states PV0 to PV3 are properly formed, the row decoder 132 may apply verification voltages VR1 to VR3 corresponding to each of the program states PV1 to PV3 to the selected word line. For example, to verify that the selected memory cell is in the program state PV1, the row decoder 132 may apply the verification voltage VR1 to the selected word line. The selected memory cell with a threshold voltage lower than the verification voltage VR1 may be turned on in response to the verification voltage VR1, and the state of a bit line coupled to the selected memory cell may change. The selected memory cell with a threshold voltage higher than the verification voltage VR1 may be turned off in response to the verification voltage VR1, and the state of a bit line coupled to the selected memory cell may remain unchanged.

Thus, by sensing a state of a bit line, it may be determined whether a program operation is complete for a selected memory cell. For example, if a selected memory cell that should be in the program state PV1 is turned on in response to the verification voltage VR1, it may be determined that a program operation for the selected memory cell is incomplete. Accordingly, the program operation may proceed further to increase a threshold voltage of the selected memory cell. More specifically, as the bit line coupled to the selected memory cell is precharged to a program-allowed voltage, the threshold voltage of the selected memory cell may be increased in response to an additional program pulse.

However, if a selected memory cell that should be in the program state PV1 is turned off in response to the verification voltage VR1, a program operation for the selected memory cell may be determined to be complete. Accordingly, the program operation may proceed such that a threshold voltage of the selected memory cell is no longer elevated. More specifically, the bit line coupled to the selected memory cell may be precharged to a program-inhibited voltage, such that the threshold voltage of the selected memory cell might not change even if an additional program pulse is applied.

The control circuit 120 may determine that a program operation to the program state PV1 is complete, if the number of selected memory cells with threshold voltages lower than the verification voltage VR1 among selected memory cells that are to be in the program state PV1 is less than a predetermined number. In a similar manner, the memory device 100 may use the verification voltages VR2, VR3 to determine that a program operation for the program states PV2, PV3 is complete, respectively.

Figure 5:
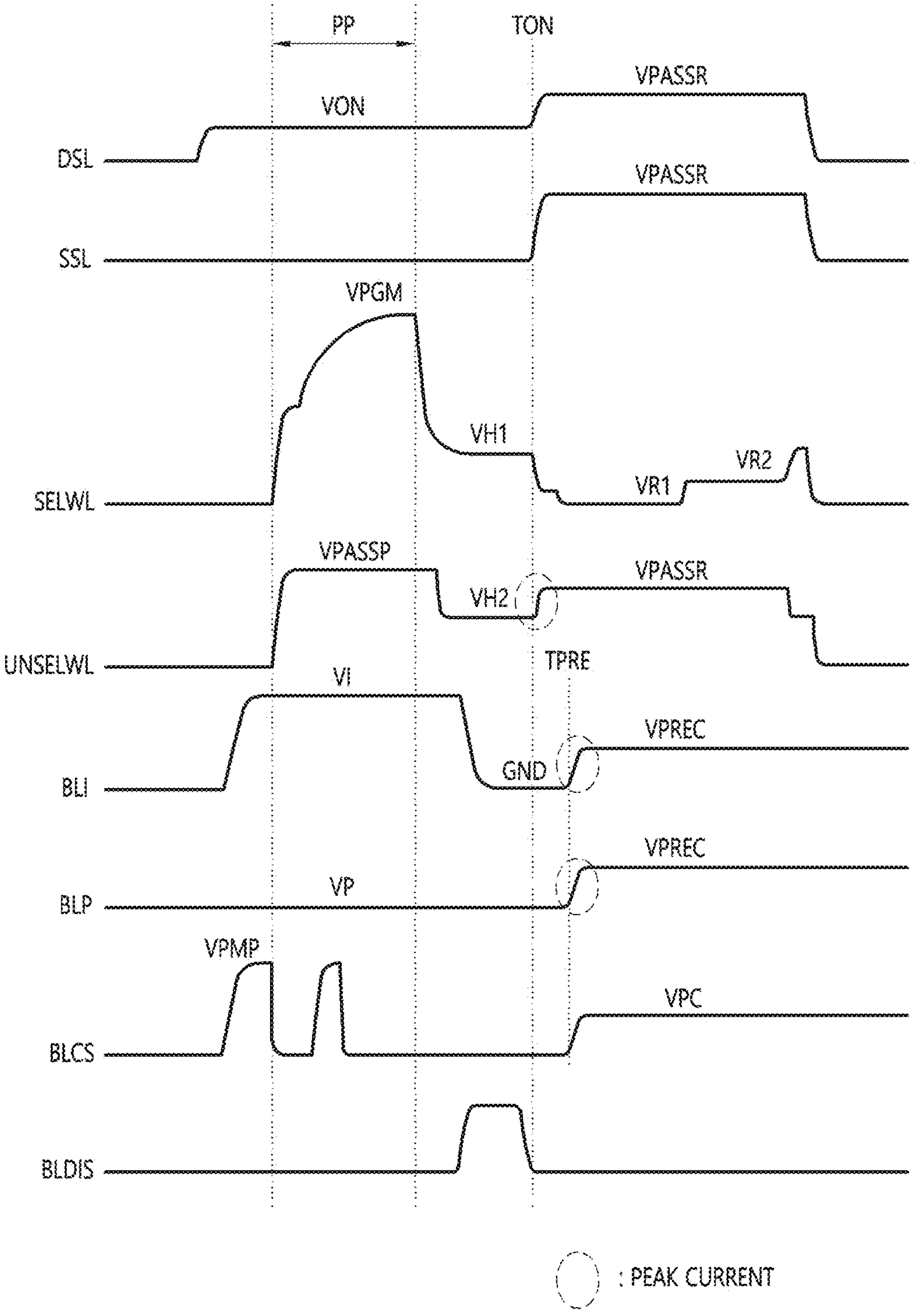
FIG. 5 is a timing diagram of a program operation based on a second precharge method according to an embodiment of the present disclosure.

FIG. 5 is a timing diagram of a program operation based on a second precharge method according to an embodiment of the present disclosure. FIG. 5 is a timing diagram of one program loop for selected memory cells. FIG. 5 illustrates a timing of at least one drain selection line DSL, at least one source selection line SSL, a selected word line SELWL, at least one unselected word line UNSELWL, at least one program-inhibited bit line BLI, and at least one program-allowed bit line BLP, coupled to selected strings including selected memory cells, as well as a timing of the precharge control signal BLCS and the discharge signal BLDIS.

First, the selected memory cells in which a program operation is performed may be memory cells contained in a single memory region. The selected word line SELWL may be a word line coupled to the selected memory cells among the word lines WL1 to WLn. The at least one unselected word line UNSELWL may be a word line that is not the selected word line SELWL among the word lines WL1 to WLn. The at least one unselected word line UNSELWL may be coupled to unselected memory cells included in the selected strings. The at least one drain selection line DSL may be coupled to drain selection transistors included in the selected strings. The at least one source selection line SSL may be coupled to source selection transistors included in the selected strings. A program-allowed bit line BLP may be a bit line coupled to a program-allowed memory cell. A program-allowed memory cell may be a memory cell among the selected memory cells having a threshold voltage that should be raised by a program pulse VPGM. A program-inhibited bit line BLI may be a bit line coupled to a program-inhibited memory cell. The program-inhibited memory cell may be a memory cell among the selected memory cells having a threshold voltage that should not be raised by the program pulse VPGM. The program-inhibited memory cell may be a memory cell that has completed a program operation among the selected memory cells.

Referring to FIG. 5, prior to a program pulse period PP during which the program pulse VPGM is applied, the bit line control circuit 131 may precharge the program-inhibited bit line BLI to a program-inhibited voltage VI and the program-allowed bit line BLP to a program-allowed voltage VP, in response to a program control voltage VPMP applied to the precharge control signal BLCS.

With the program-inhibited bit line BLI precharged to the program-inhibited voltage VI and the program-allowed bit line BLP precharged to the program-allowed voltage VP, the row decoder 132 may apply the program pulse VPGM to the selected word line SELWL during the program pulse period PP. A threshold voltage of the program-allowed memory cell may be raised in response to the program pulse VPGM. A threshold voltage of the program-inhibited memory cell may remain unchanged in response to the program pulse VPGM. The row decoder 132 may apply an intermediate voltage VH1 to the selected word line SELWL after the program pulse period PP until a memory cell turn-on time TON. The intermediate voltage VH1 may be higher than the verification voltages VR1 and VR2.

Additionally, the row decoder 132 may apply a turn-on voltage VON to the drain selection line DSL at least during the program pulse period PP. The turn-on voltage VON may be maintained until the memory cell turn-on time TON. The drain selection transistors coupled to the drain selection line DSL may turn on in response to the turn-on voltage VON.

Additionally, the row decoder 132 may apply a program pass voltage VPASSP to the unselected word line UNSELWL at least during the program pulse period PP. The row decoder 132 may apply an intermediate voltage VH2 to the unselected word line UNSELWL after the program pass voltage VPASSP until the memory cell turn-on time TON. The unselected memory cells coupled to the unselected word line UNSELWL may turn on in response to the program pass voltage VPASSP or the intermediate voltage VH2.

After the program pulse period PP, a program verification operation based on a second precharge method may be performed. For example, after the program pulse period PP but before the memory cell turn-on time TON, the discharge signal BLDIS may be enabled. Accordingly, the discharge circuit 220 may discharge the program-inhibited voltage VI of the program-inhibited bit line BLI to a ground voltage GND in response to the discharge signal BLDIS in an enabled state. The discharge signal BLDIS may be changed to a disabled state prior to the memory cell turn-on time TON.

And, at the memory cell turn-on time TON, the row decoder 132 may discharge the intermediate voltage VH1 of the selected word line SELWL. In an embodiment, the row decoder 132 may apply a selected verification voltage to the selected word line SELWL at the memory cell turn-on time TON, and the intermediate voltage VH1 may be discharged to the selected verification voltage. The row decoder 132 may sequentially apply one or more of the verification voltages VR1, VR2 to the selected word line SELWL.

Also, at memory cell turn-on time TON, the row decoder 132 may apply a verification pass voltage VPASSR to the drain selection line DSL, the source selection line SSL, and the unselected word line UNSELWL. Thus, the drain selection transistors, the source selection transistors, and the unselected memory cells may be turned on in response to the verification pass voltage VPASSR. The verification pass voltage VPASSR may be a voltage higher than one or more of the verification voltages VR1, VR2. The verification pass voltage VPASSR may be maintained while the verification voltages are applied.

Then, at a precharge time TPRE after the memory cell turn-on time TON, the control circuit 120 may apply the precharge control signal BLCS with a verification control voltage VPC. The verification control voltage VPC may be lower than the program control voltage VPMP. The bit line control circuit 131 may apply a verification precharge voltage VPREC to the program-inhibited bit line BLI and the program-allowed bit line BLP in response to the verification control voltage VPC. The verification precharge voltage VPREC may be a voltage equal to the verification control voltage VPC minus a threshold voltage of the first NMOS transistor N1.

Depending on whether a threshold voltage of the program-allowed memory cell is higher or lower than the verification voltage applied to the selected word line SELWL, the program-allowed memory cell may be turned off or turned on, and a state of the program-allowed bit line BLP precharged with the verification precharge voltage VPREC may be maintained or changed accordingly. A sub-circuit coupled to the program-allowed bit line BLP may sense the state of the program-allowed bit line BLP and determine whether a program operation to the program-allowed memory cell is complete or incomplete. If the program operation on the program-allowed memory cell is determined to be incomplete, an additional program loop may be iterated over the program-allowed memory cell. If the program operation for the program-allowed memory cell is determined to be complete, the program-allowed memory cell may be changed to a program-inhibited memory cell in a next program loop.

On the other hand, in an embodiment, the operation of applying the verification pass voltage VPASSR to the unselected word line UNSELWL at the memory cell turn-on time TON and the operation of precharging the program-inhibited bit line BLI and the program-allowed bit line BLP to the verification precharge voltage VPREC at the precharge time TPRE may have a large current consumption, resulting in a large peak current. However, according to an embodiment of the present disclosure, these operations are performed at memory cell turn-on time TON and the precharge time TPRE, respectively, with a time interval, so that the peak current can be suppressed.

On the other hand, in an embodiment, because a program operation for the program-inhibited memory cell is completed, a state of the program-inhibited bit line BLI is not sensed in the program verification operation, but the program-inhibited bit line BLI may also be precharged to the verification precharge voltage VPREC together with the program-allowed bit line BLP to suppress the coupling effect between the bit lines BL1 to BLm so that the voltages of the bit lines BL1 to BLm settle quickly.

Figure 6:
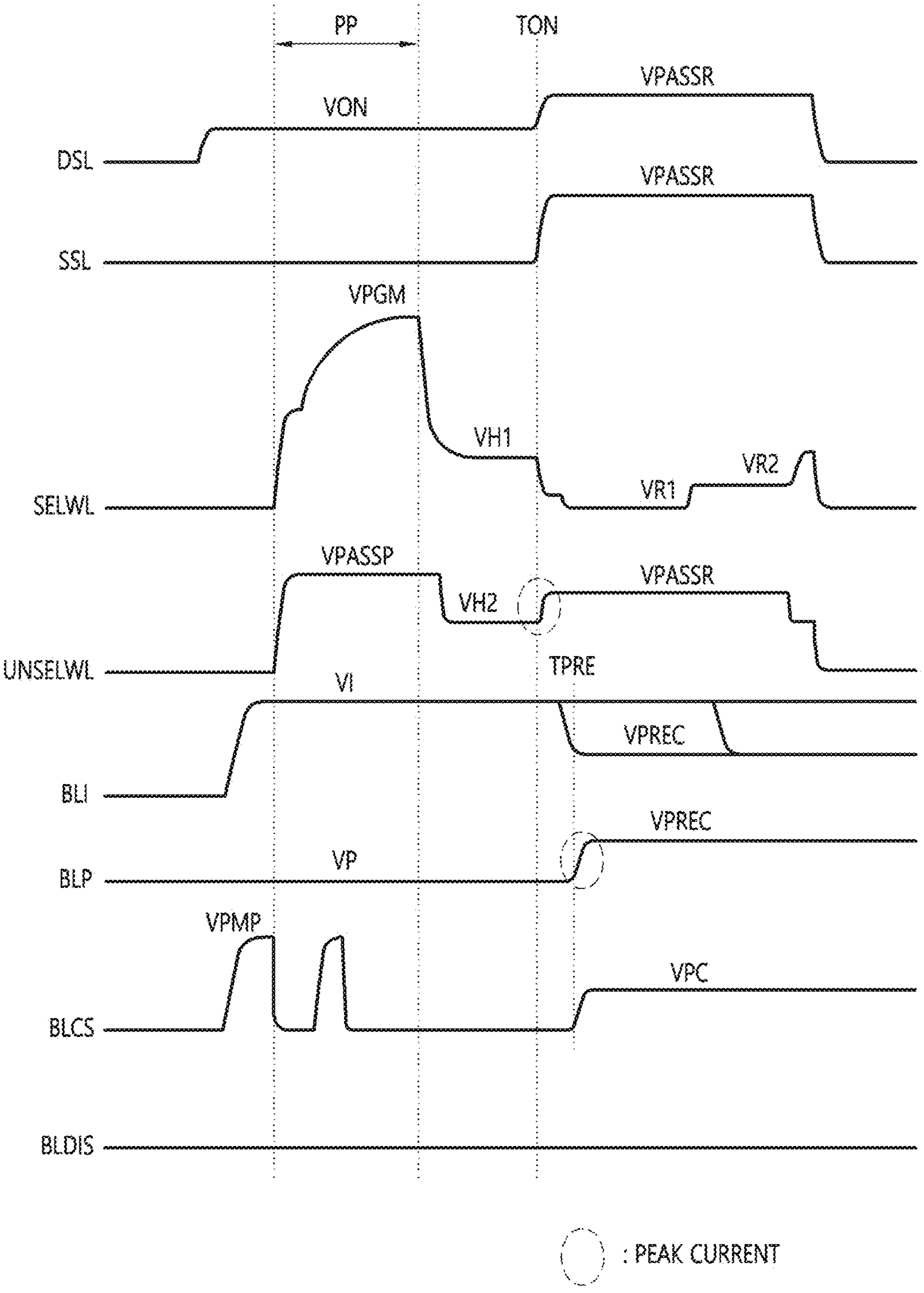
FIG. 6 is a timing diagram of a program operation based on a first precharge method according to an embodiment of the present disclosure.

FIG. 6 is a timing diagram of a program operation based on a first precharge method according to an embodiment of the present disclosure.

Referring to FIG. 6, after the program pulse period PP, a program verification operation based on the first precharge method may be performed. For example, the discharge signal BLDIS may be enabled after the program pulse period PP in the second precharge method (i.e., see FIG. 5), but might not be enabled in the first precharge method (i.e., see FIG. 6). Therefore, the operation to discharge the program-inhibited voltage VI held on the program-inhibited bit line BLI to the ground voltage GND during the program pulse period PP might not be performed. The program-inhibited voltage VI on the program-inhibited bit line BLI may be held without being discharged to the ground voltage GND or may be discharged to the verification precharge voltage VPREC.

More specifically, at the memory cell turn-on time TON after the program pulse period PP, the row decoder 132 may apply the verification pass voltage VPASSR to the drain selection line DSL, the source selection line SSL, and the unselected word line UNSELWL. Thus, the drain selection transistors, the source selection transistors, and the unselected memory cells may be turned on in response to the verification pass voltage VPASSR.

And, at the memory cell turn-on time TON, the row decoder 132 may discharge the intermediate voltage VH1 of the selected word line SELWL. In an embodiment, the row decoder 132 may apply the selected verification voltage to the selected word line SELWL at the memory cell turn-on time TON, and the intermediate voltage VH1 may be discharged to the selected verification voltage. The row decoder 132 may sequentially apply one or more of the verification voltages VR1, VR2 to the selected word line SELWL.

When the program-inhibited memory cell is turned on in response to the verification voltage applied to the selected word line SELWL, a channel may be formed through the string from the program-inhibited bit line BLI to the source line SL. In this case, the program-inhibited voltage VI on the program-inhibited bit line BLI may begin to be discharged through the channel in the string. For example, a program-inhibited memory cell in the program state PV0 may be turned on in response to verification voltage VR1, and the program-inhibited voltage VI of a corresponding program-inhibited bit line BLI may be discharged through the channel of the string. For example, a program-inhibited memory cell in the program state PV1 may be turned on in response to the verification voltage VR2, and the program-inhibited voltage VI of a corresponding program-inhibited bit line BLI may be discharged through the channel of the string.

And when the program-inhibited memory cell is turned off in response to the verification voltage applied to the selected word line SELWL, the program-inhibited voltage VI of the program-inhibited bit line BLI may be held undischarged. For example, a program-inhibited memory cell in the program state PV2 may be turned off in response to the verification voltages VR1, VR2, and the program-inhibited voltage VI on a corresponding program-inhibited bit line BLI may be maintained.

Then, at the precharge time TPRE after the memory cell turn-on time TON, the control circuit 120 may apply the precharge control signal BLCS with the verification control voltage VPC. The bit line control circuit 131 may apply the verification precharge voltage VPREC to the program-inhibited bit line BLI in response to the verification control voltage VPC. The verification precharge voltage VPREC may be a voltage equal to the verification control voltage VPC minus the threshold voltage of the first NMOS transistor N1. Thus, the program-inhibited voltage VI of the program-inhibited bit line BLI might not be discharged to ground voltage GND, but may be discharged to the verification precharge voltage VPREC.

Also, at the precharge time TPRE, the bit line control circuit 131 may also apply the verification precharge voltage VPREC to the program-allowed bit line BLP in response to the verification control voltage VPC applied to the precharge control signal BLCS. The program-allowed bit line BLP, which was holding the program-allowed voltage VP, may be precharged to the verification precharge voltage VPREC.

According to an embodiment of the present disclosure, before applying the verification precharge voltage VPREC to the program-inhibited bit line BLI, the operation of discharging the program-inhibited voltage VI of the program-inhibited bit line BLI to the ground voltage GND is not performed, so that the current consumption is reduced and the peak current can be further suppressed.

In addition, in an embodiment, the operation of applying the verification pass voltage VPASSR to the unselected word line UNSELWL at the memory cell turn-on time TON and the operation of precharging the program-allowed bit line BLP to the verification precharge voltage VPREC at the precharge time TPRE may have a large current consumption, resulting in a large peak current. However, according to an embodiment of the present disclosure, these operations are performed at the memory cell turn-on time TON and the precharge time TPRE, respectively, with a time interval, so that the peak current can be suppressed.

Figure 7:
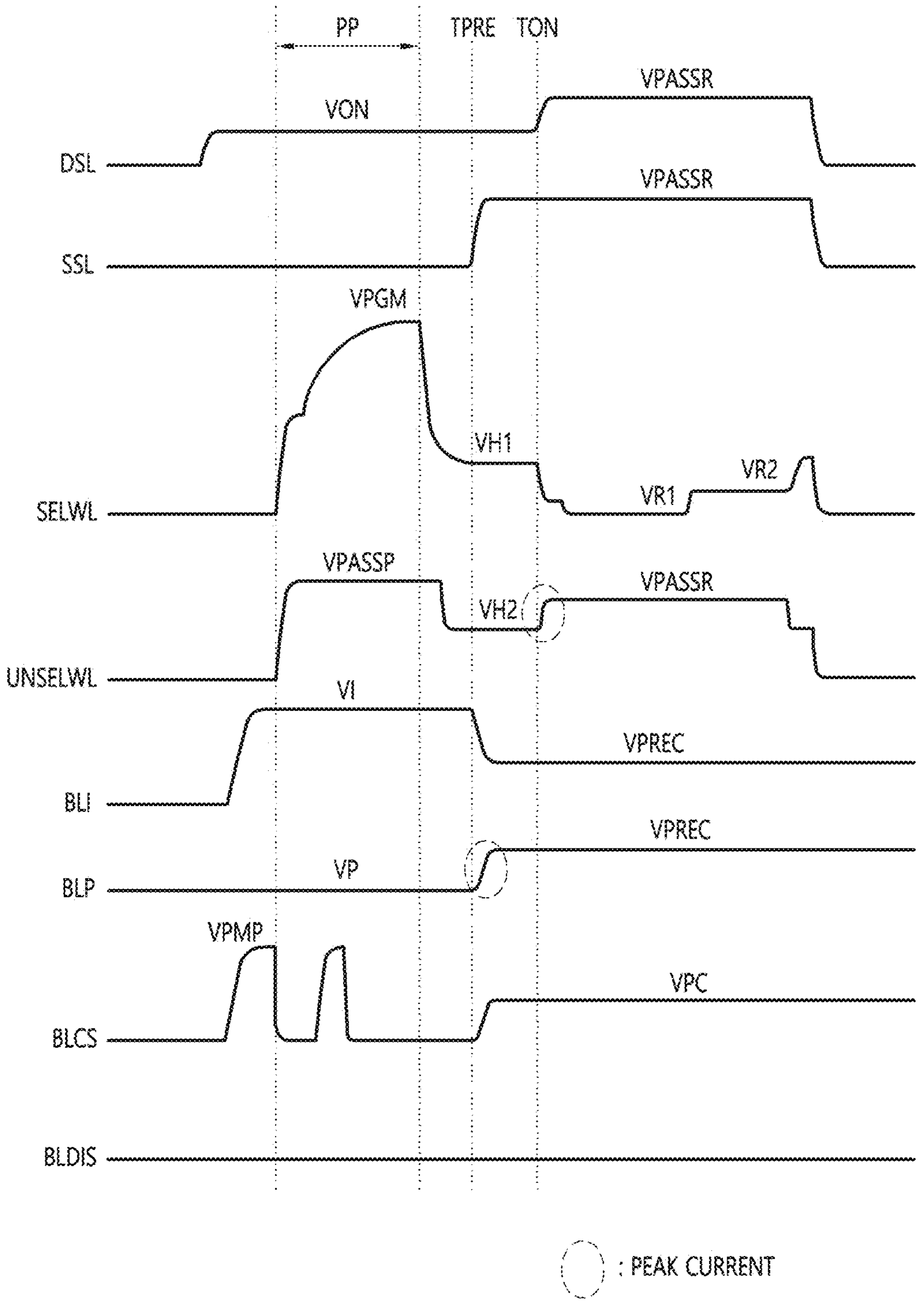
FIG. 7 is a timing diagram of a program operation based on a first precharge method according to an embodiment of the present disclosure.

FIG. 7 is a timing diagram of a program operation based on a first precharge method according to an embodiment of the present disclosure.

Referring to FIG. 7, after the program pulse period PP, a program verification operation based on the first precharge method may be performed. For example, the discharge signal BLDIS may be enabled after the program pulse period PP in the second precharge method (i.e., see FIG. 5), but might not enabled in the first precharge method (i.e., see FIG. 7). Therefore, the operation to discharge the program-inhibited voltage VI held on the program-inhibited bit line BLI to the ground voltage GND during the program pulse period PP might not be performed. The program-inhibited voltage VI on the program-inhibited bit line BLI may be held without being discharged to the ground voltage GND or may be discharged to the verification precharge voltage VPREC.

However, apart from the first precharge method described with reference to FIG. 6, at the precharge time TPRE after the program pulse period PP, the row decoder 132 may apply the verification pass voltage VPASSR to the source selection line SSL. Thus, the source selection transistors may be turned on in response to the verification pass voltage VPASSR. The row decoder 132 may also apply a turn-on voltage VON to the drain selection line DSL at the precharge time TPRE and intermediate voltages VH1, VH2 to the selected word line SELWL and unselected word line UNSELWL, respectively. In an embodiment, memory cells may be turned on in response to the intermediate voltages VH1, VH2. Thus, a channel may be formed through the string from the program-inhibited bit line BLI to the source line SL.

Then, the bit line control circuit 131 may apply the verification precharge voltage VPREC to the program-inhibited bit line BLI in response to the verification control voltage VPC applied to the precharge control signal BLCS at the precharge time TPRE. As a result, the program-inhibited voltage VI on the program-inhibited bit line BLI may be discharged through the channel of the string to the verification precharge voltage VPREC.

Additionally, at the precharge time TPRE, the bit line control circuit 131 may also apply the verification precharge voltage VPREC to the program-allowed bit line BLP in response to the verification control voltage VPC applied to the precharge control signal BLCS. The program-allowed bit line BLP, which was holding the program-allowed voltage VP, may be precharged to the verification precharge voltage VPREC.

Then, at the memory cell turn-on time TON after the precharge time TPRE, the row decoder 132 may apply the verification pass voltage VPASSR to the drain selection line DSL and the unselected word line UNSELWL.

After the memory cell turn-on time TON, the row decoder 132 may sequentially apply one or more of the verification voltages VR1, VR2 to the selected word line SELWL. Thus, a program verification operation may be performed.

In summary, in an embodiment, the precharge time TPRE may precede the memory cell turn-on time TON after the program pulse period PP. Thus, in an embodiment, settling to the verification precharge voltage VPREC of the program-inhibited bit line BLI and program-allowed bit line BLP may be accelerated, and consequently, the execution time of the program operation may be reduced.

Further, according to an embodiment of the present disclosure, the operation of discharging the program-inhibited voltage VI of the program-inhibited bit line BLI to the ground voltage GND is not performed before applying the verification precharge voltage VPREC to the program-inhibited bit line BLI, so that the current consumption is reduced and the peak current can be further suppressed.

In addition, in an embodiment, the operation of precharging the program-allowed bit line BLP to the verification precharge voltage VPREC at the precharge time TPRE and the operation of applying the verification pass voltage VPASSR to the unselected word line UNSELWL at the memory cell turn-on time TON may have a large current consumption, resulting in a large peak current. However, according to an embodiment of the present disclosure, these operations are performed at the precharge time TPRE and at the memory cell turn-on time TON, respectively, with a time interval, so that the peak current can be suppressed. In an embodiment, the dotted circles of FIGS. 5, 6, and 7 indicate the locations of peak current being suppressed.

Figure 8:
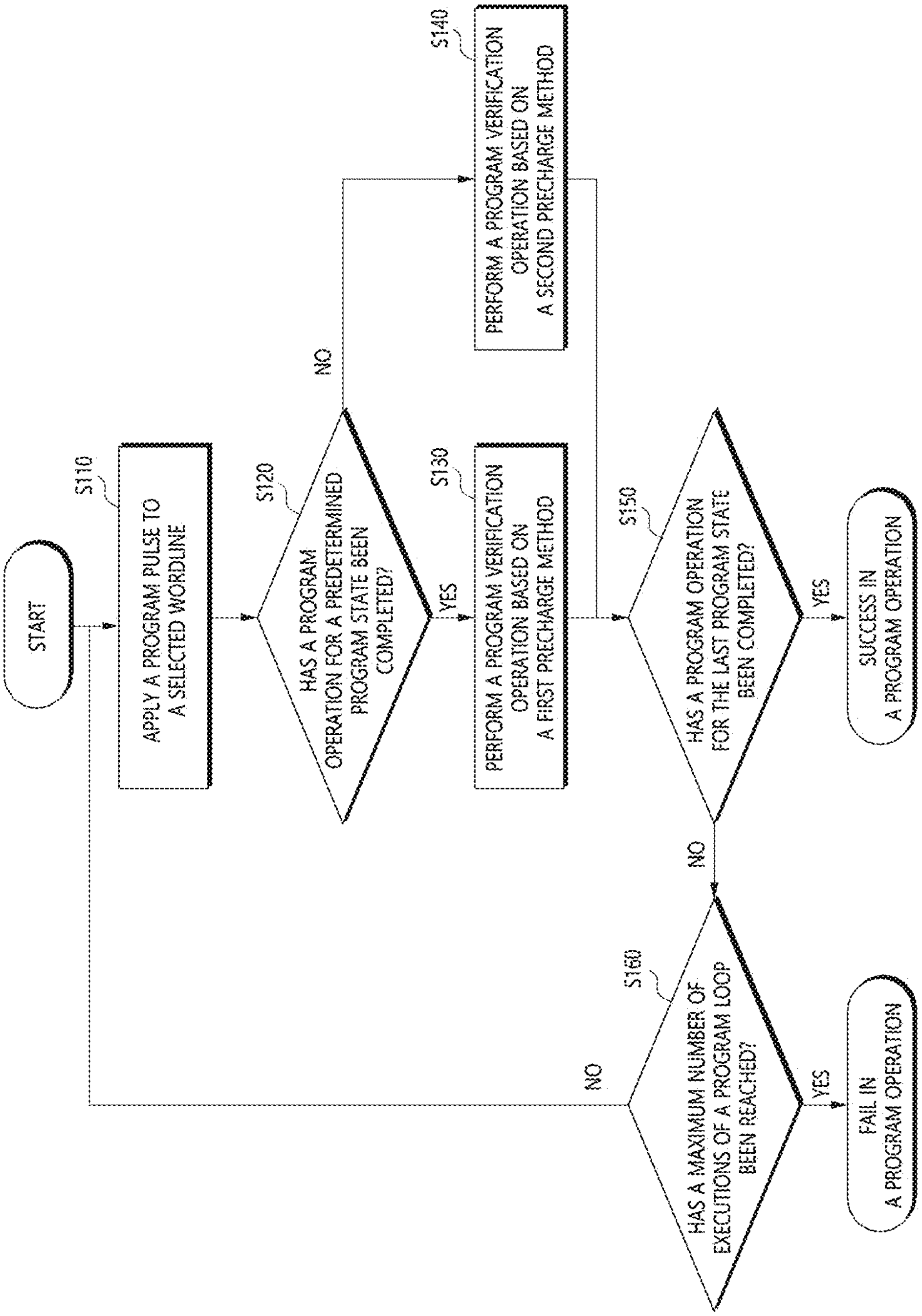
FIG. 8 is a flowchart illustrating a program operation method of the memory device of FIG. 1 according to an embodiment of the present disclosure.

FIG. 8 is a flowchart illustrating an operation method of the memory device 100 of FIG. 1 according to an embodiment of the present disclosure.

Referring to FIGS. 1 and 5 to 8, in operation S110, the peripheral circuit 130 may apply the program pulse VPGM to the selected word line SELWL during the program pulse period PP under control of the control circuit 120.

In operation S120, the control circuit 120 may determine whether a program operation is complete for a predetermined program state. When the program operation is complete for the predetermined program state, the procedure may proceed to operation S130. If the program operation is incomplete for the predetermined program state, the procedure may proceed to operation S140.

In operation S130, the peripheral circuit 130, under control of the control circuit 120, may perform a program verification operation based on the first precharge method. The first precharge method may be to discharge the program-inhibited voltage VI of the program-inhibited bit line BLI to the verification precharge voltage VPREC without discharging to the ground voltage GND after the program pulse period PP. The first precharge method may be the method described with reference to FIG. 6 or the method described with reference to FIG. 7.

In operation S140, the peripheral circuit 130 may perform a program verification operation based on the second precharge method under control of the control circuit 120. The second precharge method may be to discharge the program-inhibited voltage VI of the program-inhibited bit line BLI to the ground voltage GND after the program pulse period PP, and then precharge the program-inhibited bit line BLI to the verification precharge voltage VPREC. The second precharge method may be the method described with reference to FIG. 5.

In operation S150, the control circuit 120 may determine if a program operation is in a completed state for the last program state (e.g., the program state PV3 in FIG. 4). When the program operation in a completed state for the last program state, the program operation may be determined to be successful and the procedure may terminate. When the program operation is in an incomplete state for the last program state, the procedure may proceed to operation S160.

In operation S160, the control circuit 120 may determine if a maximum number of executions of the program loop has been reached. When the maximum number of executions of the program loop has been reached, the program operation may be determined to have failed and the procedure may terminate. If the maximum number of executions of the program loop has not been reached, the procedure may proceed to operation S110 to perform an additional program loop.

In summary, by determining the operation S120, the program verification operation according to the first precharge method might not be performed from the beginning of the program operation, but may be performed after the program operation has progressed to a certain extent. Specifically, in an embodiment, at the beginning of the program operation, the program verification operation according to the first precharge method might not be performed because the number of program-inhibited bit lines is small and the effect of reducing current consumption by the program verification operation according to the first precharge method may be small. Instead, in an embodiment, at the beginning of the program operation, the program verification operation according to the second precharge method may be performed to allow the voltages of the bit lines BL1 to BLm to settle more stably and quickly. And, in an embodiment, after the program operation has progressed to the certain extent, the program verification operation according to the first precharge method may be performed because the number of program-inhibited bit lines is large, and the effect of reducing current consumption by the program verification operation according to the first precharge method is large.

In an embodiment, the predetermined program state of the operation S120 may be determined by performing tests to maximize various operation performances (current consumption, settling time, etc.).

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that the meaning and scope of the claims and all changes or modified forms derived from the equivalent concept thereof are included in the scope of the present disclosure.

What is claimed is:

1. A memory device, comprising:

a bit line control circuit configured to apply a verification precharge voltage after a program pulse period to a program-inhibited bit line maintaining a program-inhibited voltage during the program pulse period; and a row decoder configured to form a channel in a string coupled between the program-inhibited bit line and a source line, wherein the program-inhibited voltage maintained on the program-inhibited bit line during the program pulse period is discharged through the channel such that a voltage level of the program-inhibited bit line is reduced from the program-inhibited voltage to the verification precharge voltage.

2. The memory device of claim 1, wherein the row decoder is further configured to form the channel at a memory cell turn-on time after the program pulse period, and the bit line control circuit is further configured to apply the verification precharge voltage to the program-inhibited bit line at a precharge time after the memory cell turn-on time.

3. The memory device of claim 2, wherein the row decoder is further configured to turn on at least one source selection transistor included in the string and coupled to the source line at the memory cell turn-on time.

4. The memory device of claim 2, wherein the row decoder is further configured to apply a verification pass voltage higher than a verification voltage applied to a selected word line to at least one unselected word line coupled to the string at the memory cell turn-on time.

5. The memory device of claim 1, wherein the row decoder is further configured to form the channel at a precharge time after the program pulse period, and the bit line control circuit is further configured to apply the verification precharge voltage to the program-inhibited bit line at the precharge time.

6. The memory device of claim 5, wherein the row decoder is further configured to turn on at least one source selection transistor included in the string and coupled to the source line at the precharge time.

7. The memory device of claim 5, wherein the row decoder is further configured to apply a verification pass voltage higher than a verification voltage applied to a selected word line to at least one unselected word line coupled to the string at a memory cell turn-on time after the precharge time.

8. The memory device of claim 1, wherein the bit line control circuit comprises an NMOS (N-channel metal-oxide semiconductor) transistor coupled to the program-inhibited bit line, and the verification precharge voltage is a voltage equal to a voltage applied to a gate of the NMOS transistor minus a threshold voltage of the NMOS transistor.

9. The memory device of claim 1, wherein the bit line control circuit is further configured to apply the verification precharge voltage after the program pulse period to a program-allowed bit line maintaining a program-allowed voltage during the program pulse period.

10. A memory device, comprising:

a bit line control circuit configured to apply a program-inhibited voltage to a program-inhibited bit line before a program pulse period, and configured to apply a verification precharge voltage to the program-inhibited bit line at a precharge time after the program pulse period, wherein the program-inhibited voltage of the program-inhibited bit line is discharged to the verification precharge voltage; and a row decoder configured to apply a verification voltage to a selected word line while the verification precharge voltage is being applied to the program-inhibited bit line.

11. The memory device of claim 10, wherein the row decoder is further configured to form a channel in a string coupled between the program-inhibited bit line and a source line at a memory cell turn-on time after the program pulse period, and the program-inhibited voltage of the program-inhibited bit line is discharged through the channel.

12. The memory device of claim 11, wherein the row decoder is further configured to turn on at least one source selection transistor included in the string and coupled to the source line at the memory cell turn-on time.

13. The memory device of claim 11, wherein the row decoder is further configured to apply a verification pass voltage higher than the verification voltage to at least one unselected word line coupled to the string at the memory cell turn-on time.

14. The memory device of claim 11, wherein the precharge time is after the memory cell turn-on time.

15. The memory device of claim 10, wherein the row decoder is further configured to form a channel in a string coupled between the program-inhibited bit line and a source line at the precharge time, and the program-inhibited voltage of the program-inhibited bit line is discharged through the channel.

16. The memory device of claim 15, wherein the row decoder is further configured to turn on at least one source selection transistor included in the string and coupled to the source line at the precharge time.

17. The memory device of claim 15, wherein the row decoder is further configured to apply a verification pass voltage higher than the verification voltage to at least one unselected word line coupled to the string at a memory cell turn-on time after the precharge time.

18. A method of performing a program operation with a memory device, the method comprising:

determining, with a control circuit, a precharge method for a program verification operation as a first precharge method when a program operation is determined to be completed for a predetermined program state among a plurality of program states; and discharging, with a peripheral circuit, after a program pulse period, a program-inhibited voltage maintained on a program-inhibited bit line during the program pulse period to a verification precharge voltage according to the first precharge method.

19. The method according to claim 18, further comprising:

determining, with the control circuit, the precharge method as a second precharge method when a program operation is determined to be incomplete for the predetermined program state; and discharging, with the peripheral circuit, after the program pulse period, the program-inhibited voltage maintained on the program-inhibited bit line during the program pulse period to a ground voltage, after the program pulse period and then precharging, with the peripheral circuit, the program-inhibited bit line to the verification precharge voltage according to the second precharge method.

* * * * *